United States Patent [19]

Leger et al.

[11] Patent Number: 5,033,060
[45] Date of Patent: Jul. 16, 1991

[54] OPTICAL DEVICE FOR LASER COUPLING AND COHERENT BEAM COMBINING

[75] Inventors: James R. Leger, Groton; Gary J. Swanson, Lexington, both of Mass.

[73] Assignee: Massachusetts Institute Technology, Cambridge, Mass.

[21] Appl. No.: 527,090

[22] Filed: May 22, 1990

[51] Int. Cl.$^5$ .............................................. H01S 3/082
[52] U.S. Cl. ......................................... 372/97; 372/18;
372/101; 372/108; 350/162.16; 350/167
[58] Field of Search ..................... 372/18, 19, 95, 97,
372/98, 99, 101, 108, 50; 350/162.16, 162.17,
167, 601

[56] References Cited

U.S. PATENT DOCUMENTS

| 4,784,722 | 11/1988 | Liau et al. | 156/649 |
| 4,813,762 | 3/1989 | Leger et al. | 350/162.16 |
| 4,894,840 | 1/1990 | Liau et al. | 372/108 |

OTHER PUBLICATIONS

U.S. Patent Application S.N. 099,307, "High-Efficiency, Multilevel, Diffractive Optical Elements".
U.S. Patent Application S.N. 325,292, "Two-Dimensional Surface-Emitting Laser Array".
F. X. D'Amato et al., "Coherent Operation of an Array of Diode Lasers Using a Spatial Filter in a Talbot Cavity", Appl. Phys. Lett., vol. 55, No. 9, 1989, pp. 816–818.
J. R. Leger et al., "Astigmatic Wavefront Correction of a Gain-Guided Laser Diode Array Using Anamorphic Diffractive Microlenses", SPIE, vol. 884, 1988, pp. 82–89.
J. R. Leger et al., "Binary Optical Elements for Coherent Addition of Laser Diodes", IEEE Lasers and Electro-Optics Society Conference Proceedings, 1988 Leos Annual Meeting, pp. 468–471.
J. R. Leger, "Lateral Mode Control of an AlGaAs Laser Array in a Talbot Cavity", Appl. Phys. Lett., vol. 55, No. 4, 1989, pp. 334–336.
J. R. Leger et al., "Binary-Optics Miniature Talbot Cavities for Laser Beam Addition", Appl. Phys. Lett., vol. 56, No. 1, 1990, pp. 4–6.
J. R. Leger et al., "Coherent Addition of AlGaAs Lasers Using Microlenses and Diffractive Coupling", Appl. Phys. Lett., vol. 52, No. 21, 1988, pp. 1771–1773.

Primary Examiner—Frank Gonzalez
Assistant Examiner—Galen J. Hansen
Attorney, Agent, or Firm—Fish & Richardson

[57] ABSTRACT

An apparatus for generating a coherent combined laser beam including an array of laser elements for generating a Fresnel diffraction pattern in a plane at a distance D from the laser array, the Fresnel diffraction pattern having a non-uniform phase distribution, D being at least as large as the distance at which the beams generated by the laser array begin to substantially overlap; and an array of phase corrector elements located in the plane for reducing the degree of non-uniformity in the phase distribution; and a partially reflecting mirror for forming a resonant cavity for the laser array.

17 Claims, 12 Drawing Sheets 0.0500= TALBOT PLANE 0.0500= TALBOT PLANE 0.2400= TALBOT PLANE 0.2400= TALBOT PLANE
1.677= WAVES

OPTICAL DEVICE FOR LASER COUPLING AND COHERENT BEAM COMBINING

BACKGROUND OF THE INVENTION

The Government has rights in this invention pursuant to Contract Number F19628-85-C-0002 awarded by the Department of the Air Force.

The invention relates to an optical device for coherent combining of laser beams.

The output power capabilities of individual semiconductor lasers are typically limited. Consequently, in applications which require more power than can be obtained from a single semiconductor laser, it is often necessary to combine the output beams from several individual lasers. Commercially available linear laser arrays are available for such applications. In addition, by using monolithic surface emitting lasers, two-dimensional laser arrays can also be made. Special optics must then be used with these arrays to combine the individual beams into one high power beam.

In addition to achieving high power in the combined beam, it is also often desirable to achieve high brightness. Brightness refers to the power per unit area per unit solid angle. To achieve a high brightness requires that the individual beams be mutually coherent and that they be combined to produce a single-lobed far-field pattern with negligible side lobes.

U.S. Pat. No. 4,813,762 to Leger et al. describes one approach to achieving these objectives. The patent discloses a beam combiner that includes a diffractive lenslet array that is spaced apart from a partially reflecting mirror. Each lenslet of the lenslet array collimates a corresponding one of the beams from a laser array. In addition, the lenslets abut each other to produce a high fill factor in the resulting illumination. The distance between the lenslet array and the mirror is an integer or half integer multiple of a Talbot distance (i.e., at locations where self-images of the array are produced). The mirror reflects a portion of the light from the lenslet array back to the laser array to produce mutual coherency among the individual laser beams.

SUMMARY OF THE INVENTION

In general, in one aspect, the invention features an apparatus for generating a coherent combined laser beam. The apparatus includes an array of laser elements for generating a Fresnel diffraction pattern in a plane at a distance D from the laser array. The Fresnel diffraction pattern has a non-uniform phase distribution and D is at least as large as the distance at which the beams generated by the laser array begin to substantially overlap. The invention also includes an array of phase corrector elements located in the plane for reducing the degree of non-uniformity in the phase distribution; and a partially reflecting mirror for forming a resonant cavity for the laser array.

In general, in another aspect, the invention features an apparatus for generating a coherent combined laser beam which includes an array of laser elements; an array of phase corrector elements positioned in a plane located a distance D from the laser array for producing the combined laser beam; and a partially reflecting mirror for forming a resonant cavity for the laser array. D is selected so that the laser array generates multiple images of the laser array, each of the multiple images having an associated phase. The phase corrector array shifts the phase of each of the multiple images by an amount corresponding to the complex conjugate of the associated phase.

In a preferred embodiment the partially reflecting mirror is located between the array and the phase corrector array. In another preferred embodiment, the phase corrector array is located between the laser array and the mirror.

In general, in yet another aspect, the invention features an apparatus for combining light beams generated by an array of laser elements. The apparatus includes an array of phase corrector elements for being positioned in a plane located a distance D from the laser array, D being selected so that the laser array generates multiple images of the laser array, each of the multiple images having an associated phase. The phase corrector array is for shifting the phase of each of the multiple images by an amount corresponding to the complex conjugate of the associated phase.

In general, in still another aspect, the invention features an apparatus for combining light beams generated by an array of laser elements. The laser array generates a Fresnel diffraction pattern in a plane at a distance D from the laser array. The Fresnel diffraction pattern has a non-uniform phase distribution and D is at least as large as the distance at which the beams generated by the laser array begin to substantially overlap. The apparatus includes an array of phase corrector elements for being positioned in the plane and for reducing the degree of non-uniformity in the phase distribution.

Preferred embodiments includes the following features. The laser array is either a one-dimensional or two-dimensional array. The phase corrector array is a multi-level diffractive optics array that generates a substantially uniform phase distribution for the light from the laser array. Each of the laser elements comprises a surface emitting laser and the apparatus also includes an array of turning mirrors, each one for receiving light from a corresponding one of the laser elements. In addition, the laser array, the phase corrector array and the mirror are formed on a single substrate so as to create an integrated structure. Also, the apparatus includes a spacer for holding the phase corrector array at the distance D from the laser array.

One advantage of the invention is that it provides a monolithic external resonant cavity for coherent beam combining. Also, the monolithic external cavity can be an integral part of the substrate which contains the laser array. Another advantage is that the invention provides a way of identifying high efficiency planes (i.e., planes at which high coupling efficiencies are achievable) and of constructing a phase corrector for using those planes to couple energy from the laser array into an on-axis plane wave. In addition, the phase corrector array may be readily fabricated by using standardly available multi-level diffractive optics fabrication techniques.

Other advantages and features will become apparent from the following description of the preferred embodiment and from the claims.

DESCRIPTION OF THE PREFERRED EMBODIMENT

STRUCTURE AND OPERATION

Figure 1:
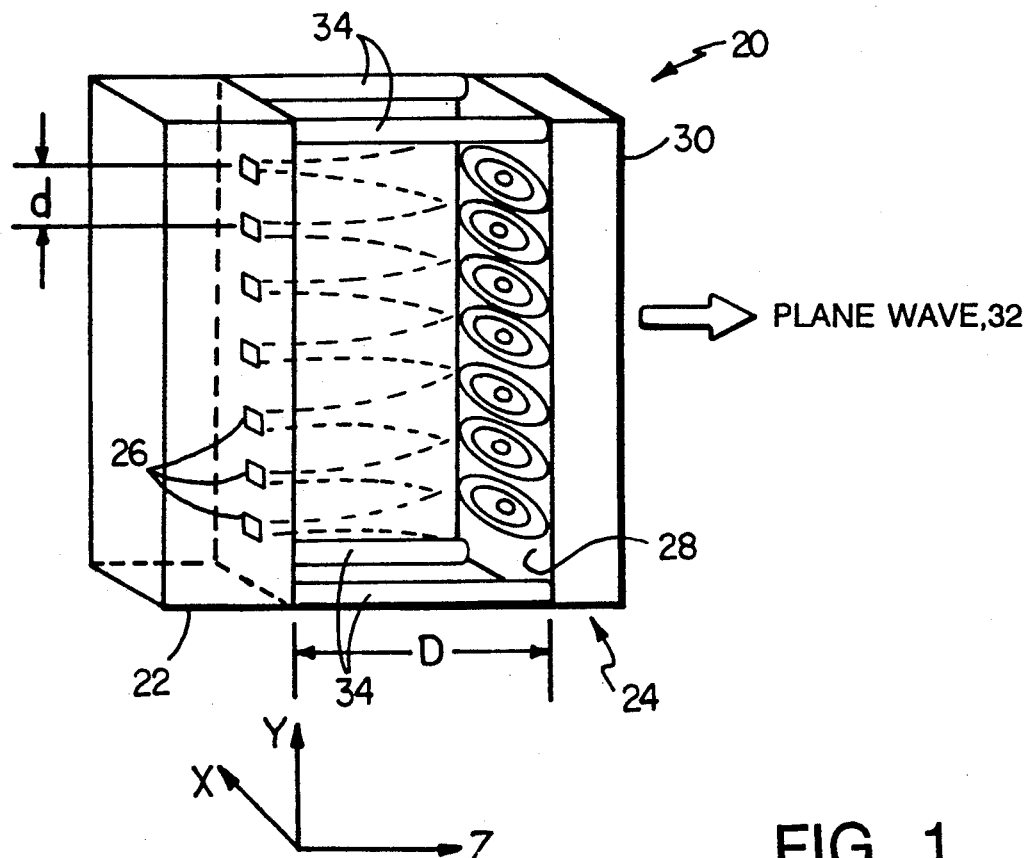
FIG. 1 illustrates a laser beam combiner.

The invention described herein exploits a phenomenon referred to as Talbot self-imaging. Talbot self-imaging occurs when a periodic array of apertures is illuminated with a coherent light source. If the array of apertures is infinite in extent, an image of the array (correct in both amplitude and phase) is formed by free-space diffraction at integer multiples of the Talbot distance $Z_T = 2d^2/\lambda$, where d is the period of the array and $\lambda$ is the wavelength of the light. The integer multiples of the Talbot distance define what may be referred to as Talbot planes.

At particular fractional Talbot distances, that is, at particular planes located between the Talbot planes (which may be referred to as fractional Talbot planes), the light distribution produces other images of the array. For example, at half a Talbot distance, i.e. $Z_T/2$, an image of the array shifted by one half period is produced. And, at the fractional Talbot plane located at $Z_T/4$, a double image consisting of one image which is in registration with original array and a second image is shifted by one half period is produced.

At even higher order fractional Talbot planes, more than two copies of shifted images are produced. For example, at $Z_T/6$, a triple image of the original array exists. Indeed, the number of copies which are produced is related to the order of the fractional Talbot plane. That is, the planes at $Z_T/2N$, where $N \geq 1$, contain N equally spaced copies of the original aperture. In this case, the copies are registered with the original aperture for even N and are shifted by ½ N for odd N. In addition, the planes at $Z_T/(2N-1)$, where $N \geq 1$, contain a second set of multiple images. In this latter case, 2N−1 equally spaced copies of properly registered images result. In each case, the phase of the light is constant across a single copy of the aperture, but changes from copy to copy within one period.

By properly selecting the fill factor for the aperture array, a quasi-uniform light intensity can be achieved at certain fractional Talbot planes. In fact, the following generalization can be stated for a one-dimensional idealized aperture array consisting of uniformly illuminated apertures. If the fill factor of the original array is $\alpha = 1/N$ (where N is an integer $\geq 1$), then full fill occurs at the fractional Talbot distance of $\alpha Z_T/2$ where there will be N replicas of the original aperture. (The one-dimensional fill factor $\alpha$ is defined as the width of the lasing aperture divided by the aperture spacing.) Moreover, the phase distribution across a single period of the image in that fractional Talbot plane consists of N equally spaced constant phase sections in which the phases relative to the phase of the section that is in register with the original aperture are given by:

$$\phi = \frac{\pi I^2}{N} \qquad \text{Eq. 1}$$

where I is an integer for even N and a half integer for odd N ranging from $-N/2$ to $(N/2)-1$. That is, the profile of the phase levels is step-wise parabolic.

For a two-dimensional array of square apertures on a square grid having a two-dimensional fill factor of $\alpha^2 = 1/N^2$, full fill also occurs at the fractional Talbot distance of $\alpha Z_T/2$. (The two-dimensional fill factor is defined as the area of the lasing apertures divided by the area of the entire array.) Each unit cell within the fractional Talbot plane consists of an $N \times N$ array of constant phase zones. The phase of each zone in the unit cell is given by:

$$\phi(I,J) = \frac{\pi(I^2 + J^2)}{N} \qquad \text{Eq. 2}$$

where I and J are integers for even N and half integers for odd N ranging from $-N/2$ to $(N/2)-1$.

Finally, fractional Talbot images also occur at higher order Talbot planes. For example, the fractional Talbot image which occurs at $\alpha Z_T/2$ also occurs at $mZ_T + \alpha Z_T/2$ and shifted images occur at $(m+½)Z_T + \alpha Z_T/2$, where m is any integer. Conjugate phase images occur at $mZ_T - \alpha Z_T/2$ and shifted conjugate phase images at $(m+½)Z_T - \alpha Z_T/2$.

Having reviewed phenomenon of Talbot self-imaging and the significance of fractional Talbot planes, an embodiment of the invention will now be described.

As shown in FIG. 1, a laser beam combiner 20 includes a laser array 22 and a phase corrector plate 24. Laser array 22 consists of seven equally spaced semiconductor laser elements 26 that have an inter-element spacing of "d". Each laser element 26 may be, for example, an edge emitting laser that generates a beam propagating in the z direction. Phase corrector plate 24 has a seven element, phase corrector array 28 formed on one of its surfaces and a partially reflecting mirror formed on an opposite surface. Each element of phase corrector array 28 is aligned with a corresponding one of laser elements 26. Phase corrector array 28 receives the light from laser array 22 and corrects its phase (i.e., makes it uniform) to thereby couple greater energy from laser array 22 into a resulting on-axis plane wave 32. A fraction of the intensity in on-axis plane wave 32 is reflected from a partially reflecting mirror 30 which is in close proximity to phase corrector array 28. The reflected light passes back through phase corrector array 28 again, and upon propagation back to laser array 22 is converted into an image of the laser array and thereby couples its energy efficiently back to laser array 22. Phase corrector plate 24 is held parallel to and at a fixed distance D from laser array 22 by spacers 34. D equals a fractional Talbot distance at which high coupling efficiency of the light into on-axis plane wave 32 is possible. Determining the precise value for D will be described shortly.

To visualize how laser beam combiner 20 operates, recognize that laser array 22 corresponds to the earlier described aperture array but with the illuminated windows replaced by semiconductor laser elements 26. When all lasers are mutually coherent, the emitted light pattern from laser array 22 exhibits the properties of Talbot self-imaging. In other words, at certain fractional Talbot planes multiple images of the laser array exist and at some fractional Talbot planes quasi-uniform illumination (i.e. close to 100% fill factor) occurs. In this example, D is selected so that phase corrector array 28 is positioned at a plane which exhibits quasi-uniform illumination. In that plane, phase corrector array 28 couples the majority of the light from laser array 22 into on-axis plane wave 32, and mirror 30 reflects a portion of on-axis plane wave 32 back through phase corrector array 28 onto laser array 22, thereby forming the resonant cavity in which lasing occurs. Note that if lasing elements 26 of laser array 22 are mutually incoherent, the fractional-Talbot effect does not form an image of the laser array after one cavity round-trip and the coupling back into the lasers is small. This increased loss prevents the incoherent state from lasing.

In the following description, it is first assumed that each laser beam generated by laser array 22 exhibits a uniform intensity across its beam width. Under that assumption, laser array 22 produces a light pattern that is similar to that produced by the previously described aperture array. In reality, however, the intensity of the beam is not uniform but rather is more accurately characterized as Gaussian. After discussing the implications of assuming a uniform beam intensity, the effects of relaxing the assumption to include a Gaussian distribution are explored.

Figure 2:
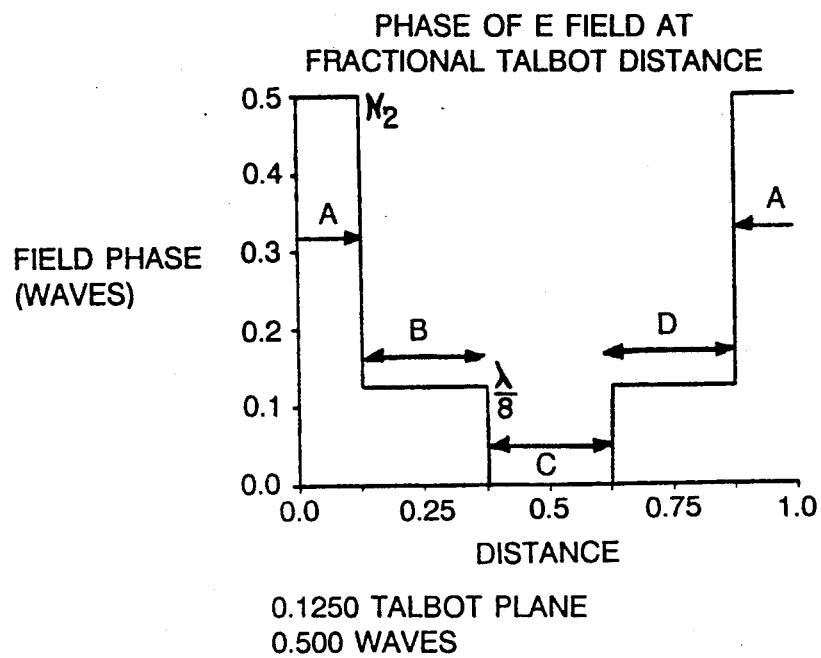
FIG. 2 illustrates the phase distribution at a full fill fractional Talbot plane for illumination generated by an idealized light source with a fill factor of $\frac{1}{4}$.

For the case of laser beams having uniform intensity distributions and assuming a fill factor of ¼ for laser array 22, full fill (i.e., uniform illumination) occurs at a fractional Talbot distance of $Z_T/8$. The phase distribution of the light at that plane, however, is not uniform; rather it is periodic with a period (or cell size) of "d". Within each cell the phase parallel to the array varies as shown in FIG. 2, that is, the illumination exhibits constant phase zones and the phase associated with the constant phase zones varies quadratically across a cell as specified by Eq. 1 above. (Note that in FIG. 2, the distance scale is normalized so that "d" equals 1.0 units, the laser is centered at 0.5 units and the beam width for the laser is 0.25 units.) As shown in FIG. 2, there are four constant phase zones per cell, namely, zone A from 0 to 0.125 and 0.875 to 1.0; zone B from 0.125 to 0.375; zone C from 0.375 to 0.625 and zone D from 0.625 to 0.875.

Phase corrector array 28 eliminates the phase differences of the impinging illumination to produce illumination having uniform amplitude and phase distribution. It does this by introducing the appropriate phase shifts in the light passing through it. The amount of introduced phase shift depends upon the relative phase of the light in the corresponding zone. In the illustrated example, phase corrector array 28 shifts the light associated with zone A by $M\lambda - \lambda/2$, the light associated with zones B and D by $M\lambda - \lambda/8$ and the light associated with zone C by $M\lambda$, where M is an integer and $\lambda$ is the wavelength of the light emitted by laser array 22. The phase correction required in the direction perpendicular to the one-dimensional array is given by a standard one-dimensional lens transmittance.

The illumination falling on mirror 30 exhibits uniform amplitude and phase distribution. Mirror 30 reflects some of that light back into laser array 22. If the distance between laser array 22 and phase corrector array 28 is sufficient to permit some interference (i.e., diffractive overlap) between neighboring beams, then the light that is reflected back onto laser array 22 causes a coupling between the laser elements of laser array 22. That is, the reflected light from each laser element "leaks" onto its neighbors and this establishes coherence among all of the resulting laser beams. The amount of coupling required to induce coherence is a function of the wavelength variations from one laser to another in the free-running (incoherent) state.

At the fractional Talbot plane that exhibits full fill, there is theoretically a complete coupling (i.e., 100% coupling efficiency) of the light from the laser beams into on-axis plane wave 32. In this example, a phase corrector array that satisfies the requirements for achieving 100% coupling efficiency has constant phase zones that correspond to the complex conjugate of the constant phase zones of the impinging light. Since the array has stepped phase characteristics, it lends itself to being fabricated by using standard binary optics fabrication techniques such as are described in U.S. patent application Ser. No. 099,307 entitled "High Efficiency Multi-level Diffractive Optical Elements", by G. Swanson and W. Veldkamp or in U.S. Pat. No. 4,813,762 by James R. Leger et al., both of which are incorporated herein by reference.

Figure 3:
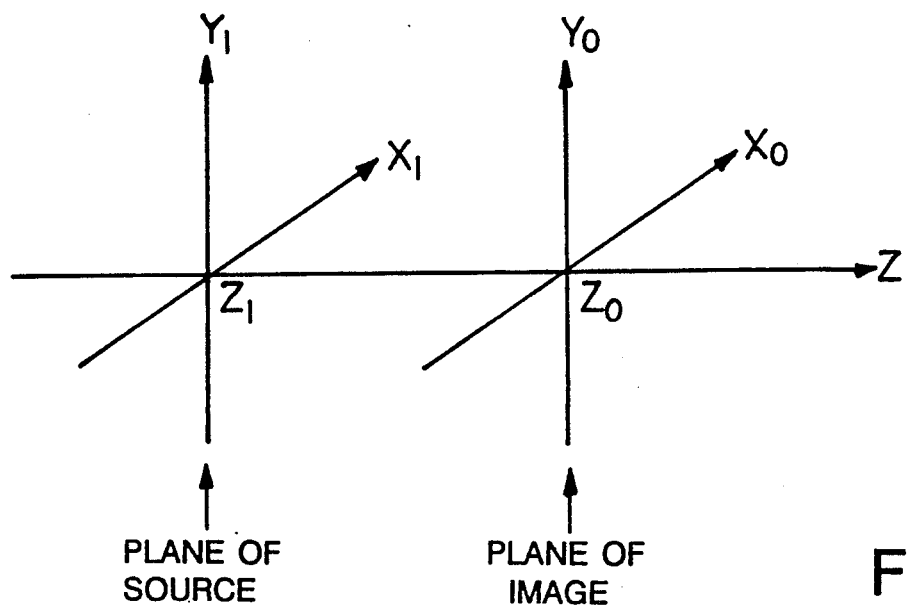
FIG. 3 illustrates the coordinate system used for the Fresnel diffraction equation.

The coupling efficiency for other fractional Talbot distances can be readily derived from the Fresnel diffraction pattern that describes the laser array light field. In the two-dimensional case, the general expression describing the fresnel diffraction pattern is as follows:

$$U(x_0, y_0) = \frac{\exp(jkz)}{j\lambda z} \int\int_{-\infty}^{+\infty} U(x_1, y_1)\exp\left(j\frac{k}{2z}[(x_0 - x_1)^2 + (y_0 - y_1)^2]\right)dx_1 dy_1 \qquad \text{Eq. 3}$$

where $U(x_0,y_0)$ is the complex field across the plane at z, $\lambda$ is the wavelength of the light and k is the wave number which equals $2\pi/\lambda$. Also note that the coordinate system that is used for Eq. 3 is as shown in FIG. 3 and that the "1" subscripts refer to the plane of the original light distribution and the "0" subscripts refer to the plane of the diffraction pattern.

For each propagation distance at which Eq. 3 is computed, it is also assumed that the phase differences across the illuminated field can be completely corrected by using an appropriately designed phase corrector array. With that assumption, the amount of power that is coupled into the on-axis plane wave is then computed to arrive at the coupling efficiency for the system. The power in the on-axis plane wave corresponds to the power contained in the central order lobe of the far field pattern and the coupling efficiency is this value divided by the total power generated by the laser array. These computations are easily performed with the aid of an appropriately programmed computer.

Figure 4:
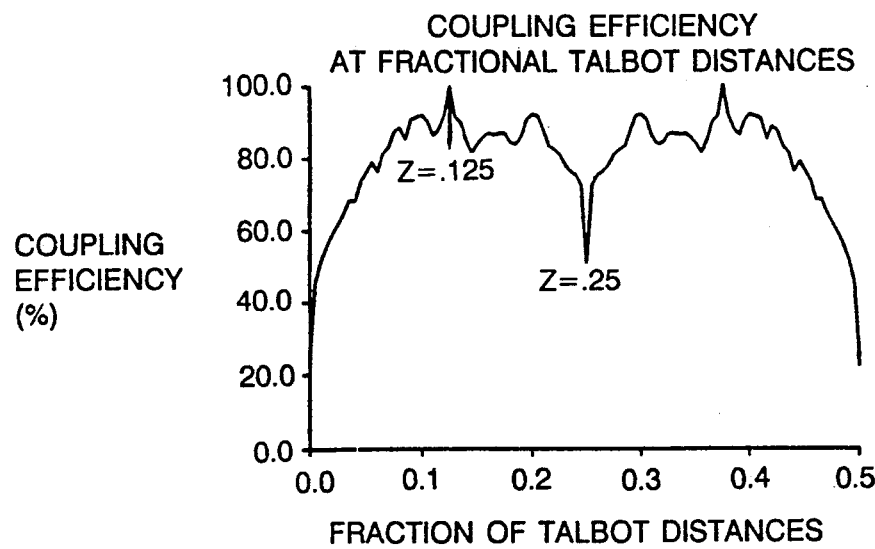
FIG. 4 illustrates the coupling efficiency at fractional Talbot distances for an idealized light source with a fill factor of ⅓.

When the above-described simulations are run for the embodiment in which a one-dimensional array of uniform intensity laser beams with a fill factor of ¼ were assumed, the coupling efficiency as a function of fractions of a Talbot distance is as shown in FIG. 4 where propagation to one-half of a Talbot distance is shown. (This curve is repeated for successive half-Talbot distances.) Note that 100% coupling efficiency (i.e., full fill illumination) occurs at the expected locations, namely, $Z_T/8$ (i.e. 0.125) and $Z_T/2 - Z_T/8$ (i.e., 0.375). Also note that the expected coupling efficiency of 50% occurs at $Z_T/4$ (i.e., 0.250) where only two images (rather than four images) appear in each cell, thereby producing a fill factor of only 0.5 rather than 1.0.

Thus, for the idealized case, optimum coupling occurs at the expected locations, namely, the fractional Talbot planes that exhibit full fill. If, however, it is assumed that the laser light beams are each characterized by a Gaussian curve, then the fractional Talbot planes which yield optimum coupling occur at locations which are different from those predicted for the uniform distribution case.

To illustrate the Gaussian amplitude model, a one-dimensional laser array with an inter-laser spacing (d) of 50 μm is used. In that array, each laser has an amplitude function of the following form:

$$A(x) = A_0 \exp[-x^2/\sigma^2].$$

The beam width $\sigma$ equals 1.13 μm and the wavelength $\lambda$ equals 0.8 μm. The Talbot distance $Z_T = 2d^2/\lambda = 6.25$ mm.

When simulations are run for this laser array, the resulting coupling efficiency curve is as shown in FIGS. 5a through 5e. For these simulations it is still assumed that the phase of the illumination can be fully corrected by the phase corrector element. The arabic numbers located at troughs in the curve represent the number of copies of the laser array that occur at the corresponding fractional Talbot distances. The phase of the illumination across a cell will be examined for several locations on the coupling efficiency curve to identify the phase characteristics that are required in phase corrector plate 24 to satisfy this assumption.

There are a number of features of the coupling efficiency curve that are noteworthy. The curve is mirror symmetric about $0.25Z_T$ and it repeats itself at $0.5Z_T$ and successive values of half-Talbot distances. As expected, multiple copies of the Gaussian amplitude distribution occur at the appropriate fractional Talbot planes. In particular, N copies of the Gaussian distribution occur at the nulls between 0.0 and 0.25 given by $Z = Z_T/2N$ and $(2N-1)$ copies occur at nulls given by $Z = Z_T/(2N-1)$. In addition, other fractional-Talbot planes are evident. For example, multiple copies are produced at propagation distances $Z = 0.25(1 - 1/N)$, where the number of copies is N for odd values of N and 2N for even values of N.

For the Gaussian amplitude distribution, the peaks in the coupling efficiency curve do not necessarily occur at the fractional Talbot plane that is predicted to be the full fill plane under the assumption of a uniform amplitude distribution. The best coupling is achieved at many different fractional Talbot distances over the range from 0.0 to 1.0 (and other locations derived by adding $MZ_T$, where M is an integer). Thus, phase corrector array 28 can be located at a distance from laser array 22 that corresponds to any one of the peaks on the curve.

Note that for purposes of determining the desired location of phase corrector array 28, a peak on the curve is considered to define a range about a point on the coupling efficiency curve which occurs at a local maximum. Over that range the coupling efficiency does not vary significantly from the value of the local maximum. See, for example, the range designated as R in FIG. 5b.

Figure 5A:
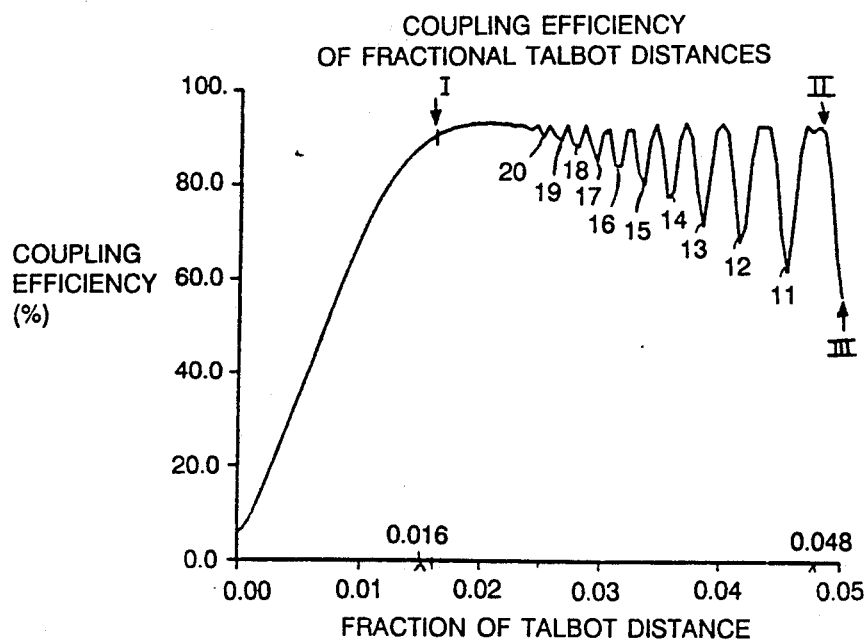
FIGS. 5a through 5e illustrate the computed coupling efficiency for a seven element array in which each laser element is assumed to have a Gaussian amplitude distribution.
Figure 5B:
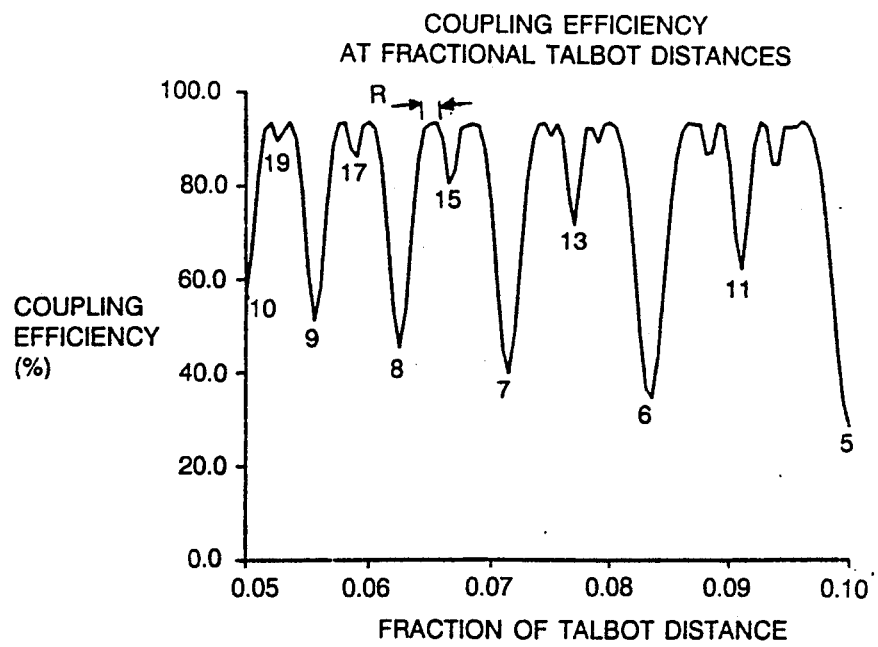
Figure 5C:
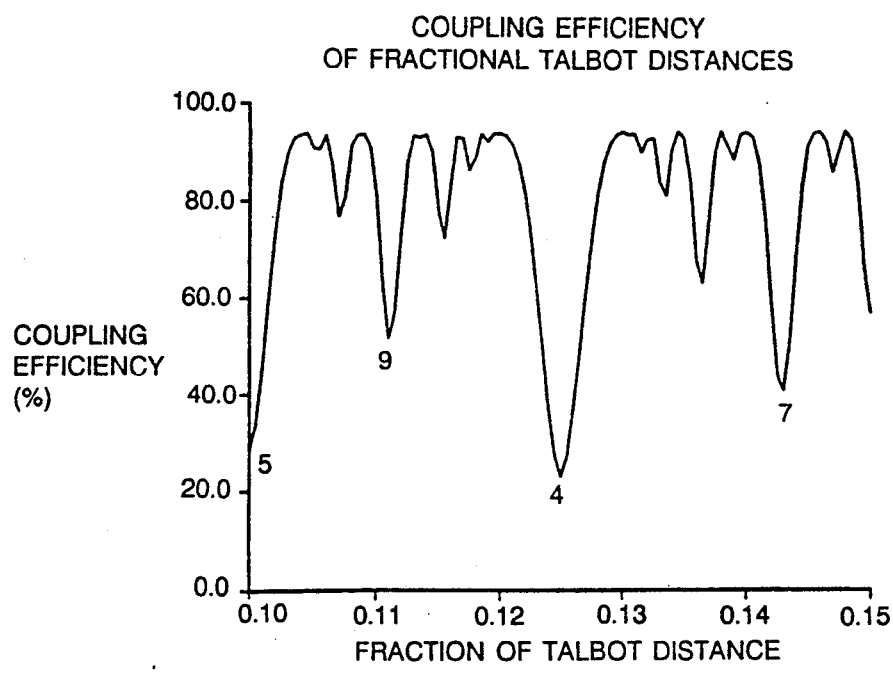
Figure 5D:
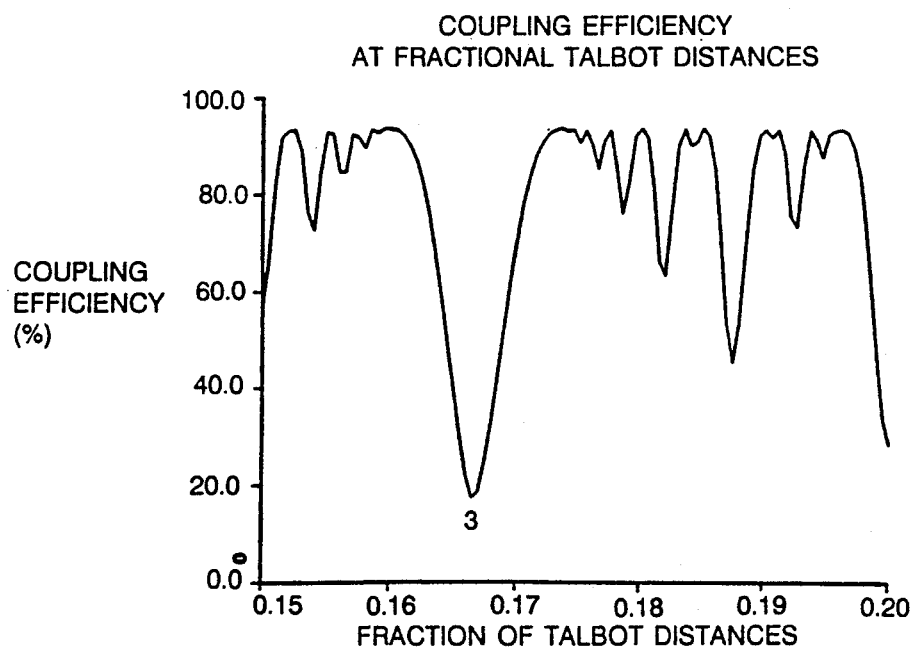
Figure 5E:
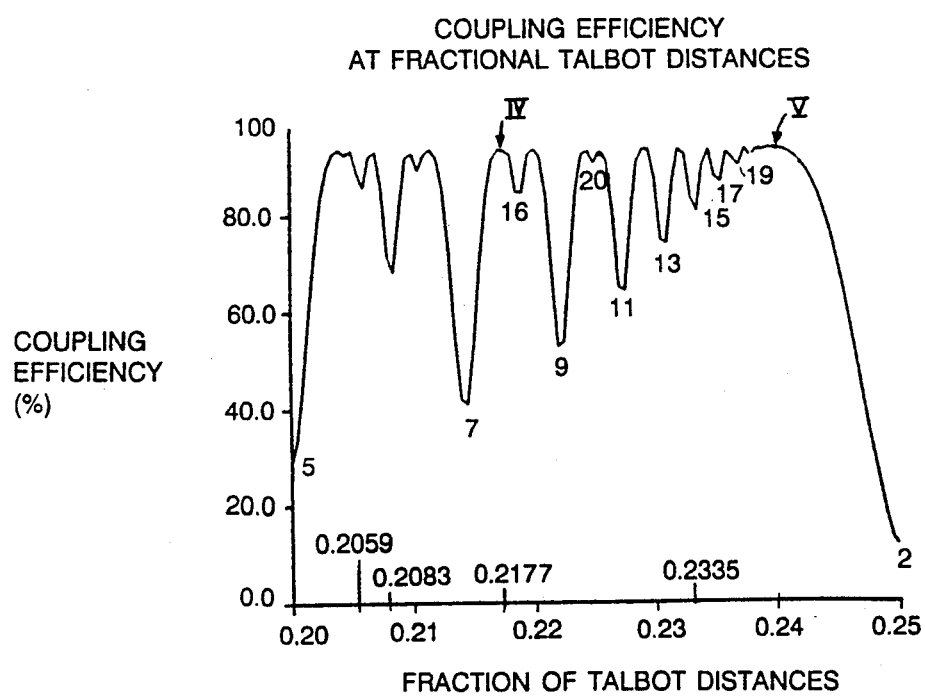
Figure 6A:
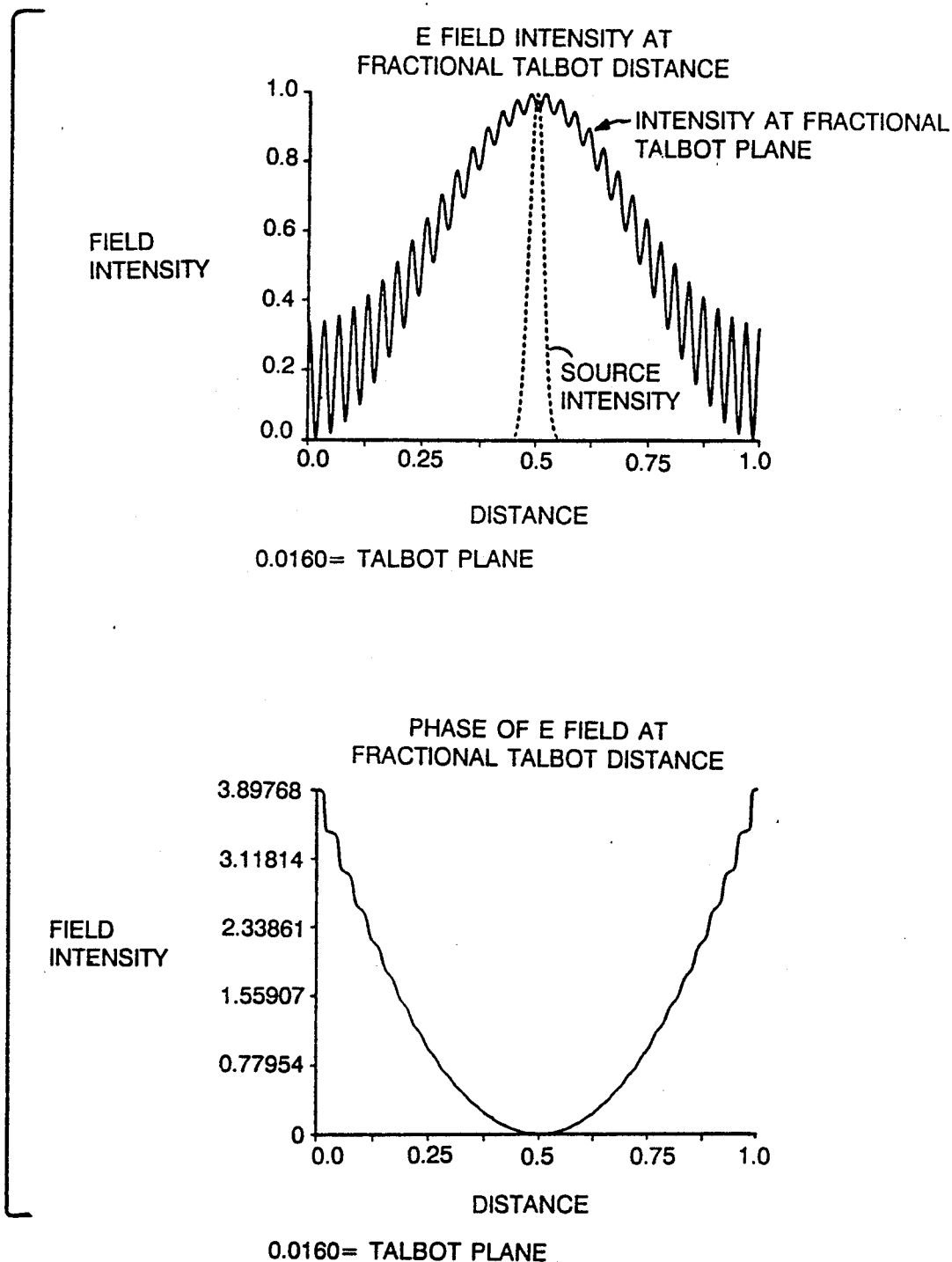
FIG. 6a illustrates the field intensity and phase distribution for point I (i.e., 0.016) on the coupling efficiency curve shown in FIG. 4.
Figure 6B:
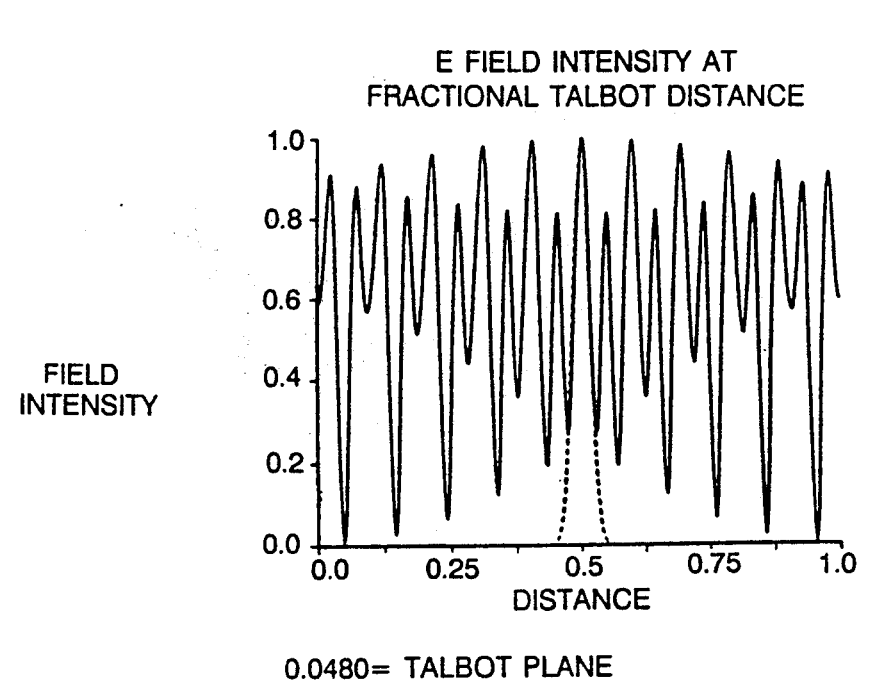
FIG. 6b illustrates the field intensity and phase distribution for point II (i.e., 0.048) on the coupling efficiency curve shown in FIG. 4.
Figure 6B:
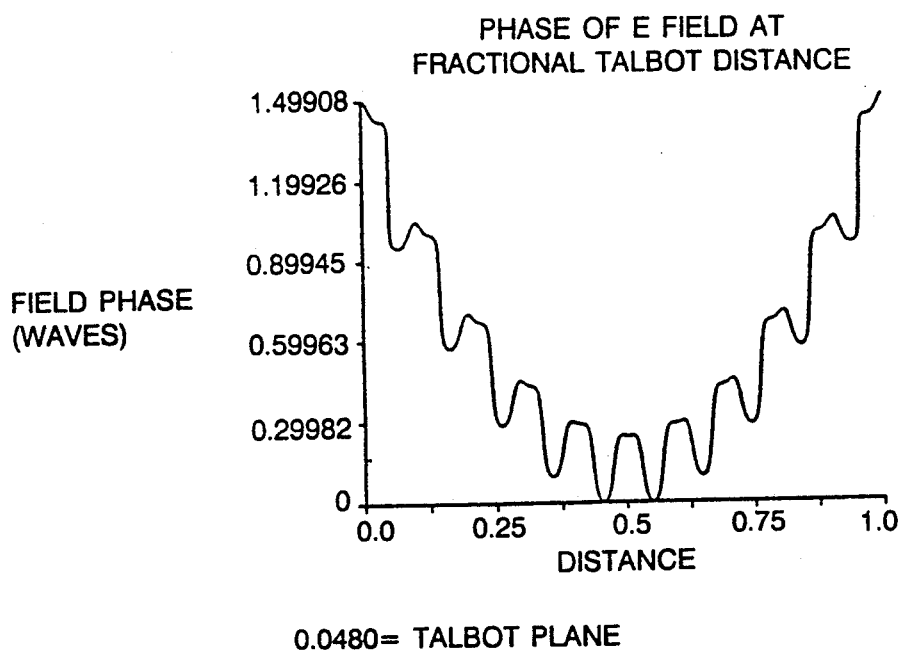
Figure 6C:
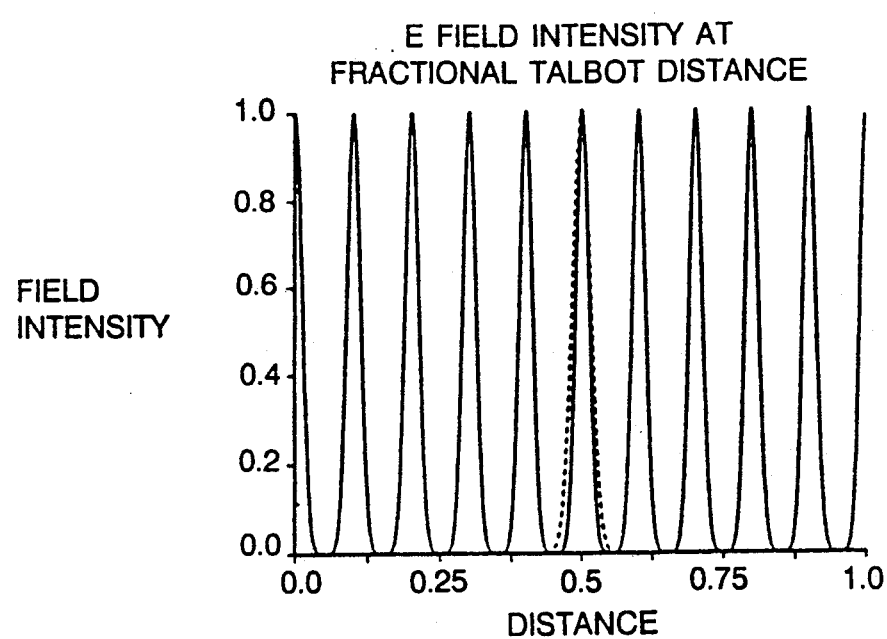
FIG. 6c illustrates the field intensity and phase distribution for point III (i.e., 0.050) on the coupling efficiency curve shown in FIG. 4.
Figure 6C:
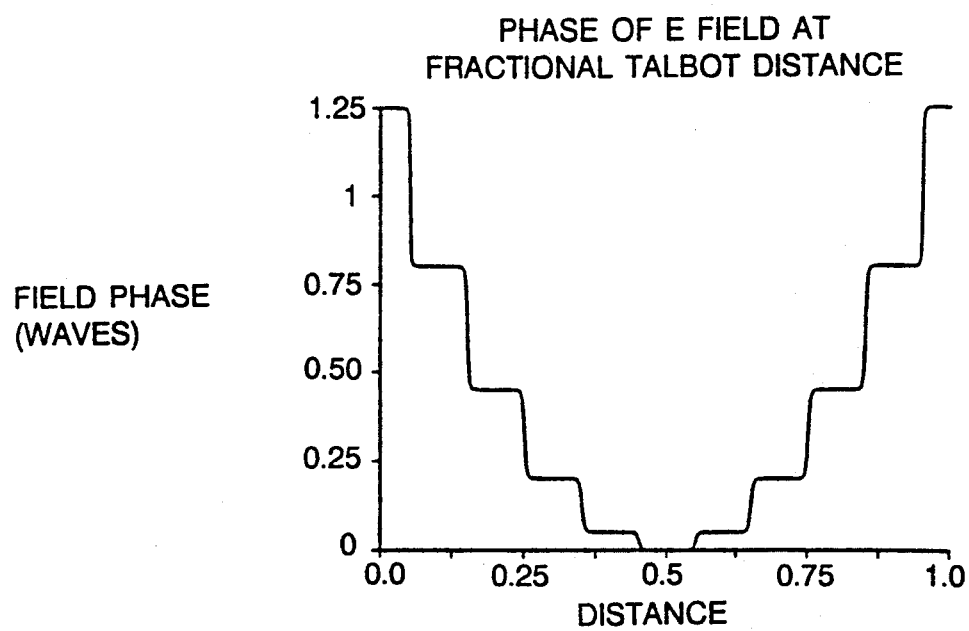
Figure 6D:
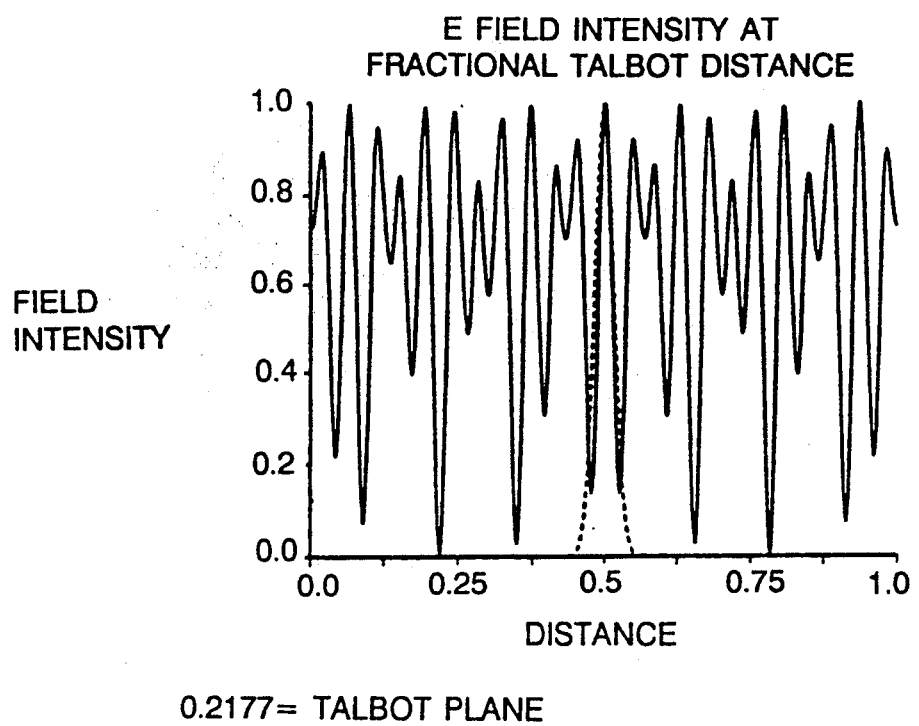
FIG. 6d illustrates the field intensity and phase distribution for point IV (i.e., 0.2177) on the coupling efficiency curve shown in FIG. 4.
Figure 6D:
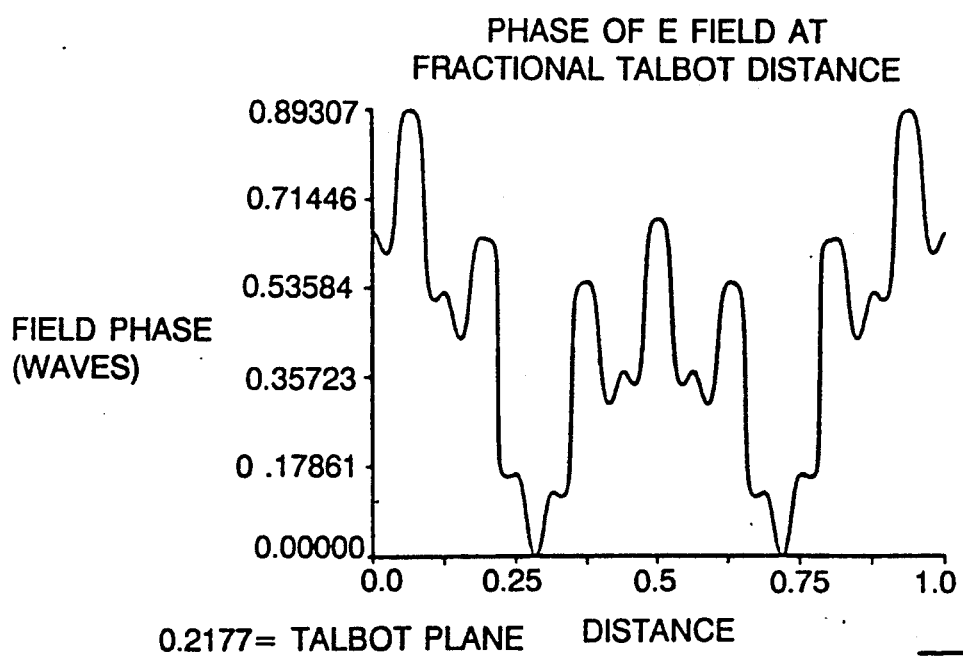
Figure 6E:
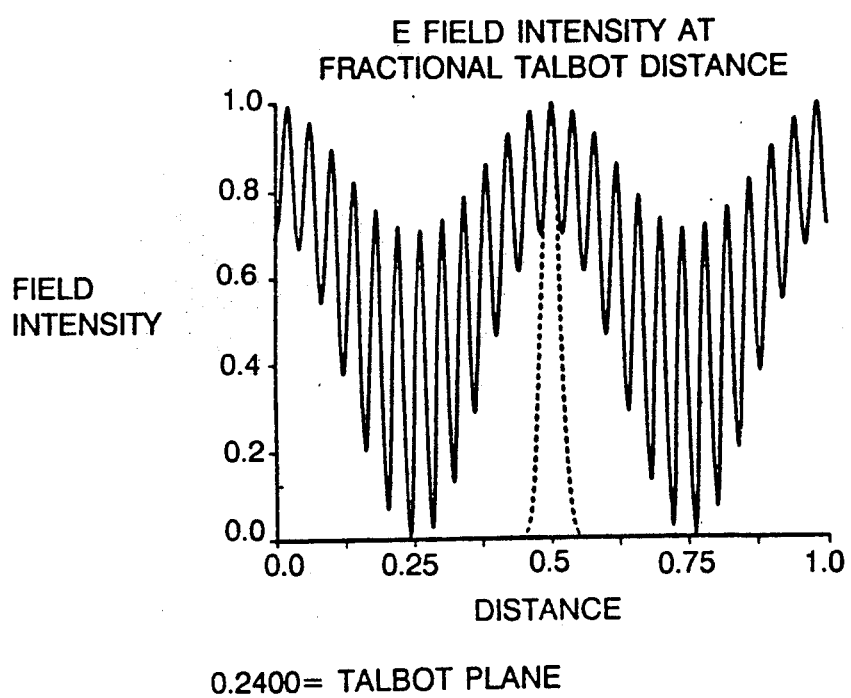
FIG. 6e illustrates the field intensity and phase distribution for point V (i.e., 0.2400) on the coupling efficiency curve shown in FIG. 4.
Figure 6E:
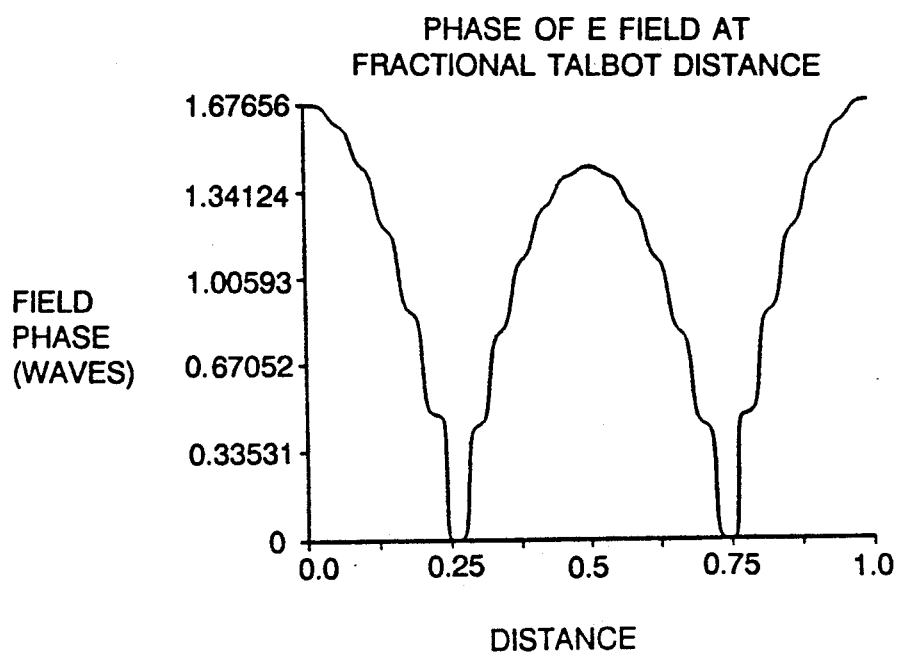

The field intensity and phase distribution across a cell were also computed for various fractional Talbot distances, namely, those identified by roman numerals I through V in FIGS. 5a and 5e. FIGS. 6a through 6e depict the results of those computations. The phase distributions for locations that are defined by $Z = Z_T/(2N)$ are step-wise approximations of a parabola where a zone of relatively constant phase exists for each copy of the Gaussian distribution (see for example FIG. 6c). As indicated, for other fractional Talbot distances, the phase distributions are not as simple. To completely correct the phase of the light, phase corrector array 28 must implement the complex conjugate of the phase distribution curve that corresponds to the particular fractional Talbot plane that was selected.

Propagation distances given by any of the high efficiency regions of the curve in FIG. 5 can be utilized. However, coupling between lasers becomes stronger as the propagation distance is increased, and the distance must be sufficiently long to insure adequate coupling or phase locking (e.g. $Z > 0.025 Z_T$ in FIG. 5). On the other hand, edge effects cause increased loss as the propagation distance increases. The proper distance is chosen by balancing these two effects to insure phase locking with a minimum of edge loss. Note that in this embodiment, the distance $Z = 0.025 Z_T$ corresponds to the distance at which substantial overlap begins to occur (i.e., sufficient power is coupled into the next laser so that phase lock may be achieved).

The above-illustrated approach is readily extended to the case of a two-dimensional laser array. In that case, the resulting phase corrector array is a two-dimensional phase structure for which the associated phase correction (i.e., the thickness of phase corrector at that point) is determined by the complex conjugate of the relative phase of the illumination at that point. This can be determined from the above described Fresnel diffraction equation (i.e., Eq. 3) computed for the two-dimensional laser array.

Figure 7:
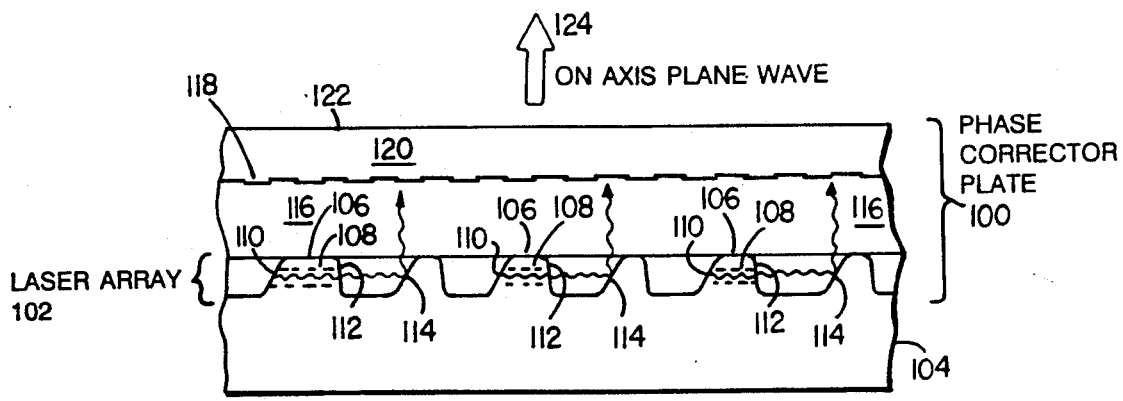
FIG. 7 illustrates an embodiment which employs surface emitting laser elements and turning mirrors which direct the emitted laser beams in a direction perpendicular to the plane of the laser array.

As shown in the cross-sectional illustration of FIG. 7, a phase corrector plate 100 can be fabricated as an integral part of a laser array 102 that is formed on a substrate 104 of, for example, InGaAsP or AlGaAs. Laser array 102 is made up of laser elements 106 that emit light in a direction parallel to the surface of substrate 104. Each laser element 106 has a gain region 108, terminated on one end by a reflecting surface 110 and terminated on the other end by an anti-reflection-coated surface 112, both surfaces 110 and 112 being perpendicular to the surface plane of substrate 104. For each laser element 106, there is a turning mirror 114 that is also formed on substrate 104. Each turning mirror 114 has a 45 degree reflecting surface (flat or curved) and is positioned on substrate 104 to receive light emitted from its associated laser element 106 and reflect that light off in a direction perpendicular to and away from the surface plane of substrate 104. For descriptions of a laser array which incorporates such turning mirrors and of a method for fabricating such a structure refer to U.S. Pat. No. 4,894,840 to J. Walpole et al. entitled "Surface Emitting Laser" and to U.S. Pat. No. 4,784,722 to J. Walpole et al. entitled "Method of Forming Surface Emitting Diode Laser", both of which are incorporated herein by reference.

Above and resting on laser array 102, there is a transparent layer 116 of dielectric material, which may, for example, consist of $SiO_2$. A phase corrector array 118 is formed on the top side of transparent layer 116. Then, on top of transparent layer 116 there is another transparent layer 120 of dielectric material having a different index of refraction from transparent layer 116. Finally, transparent layer 120 supports a flat partially reflecting mirror 122, which may, for example, be a multilayer dielectric mirror. The thickness D of transparent layer 116 is selected so that phase corrector array 118 is positioned at the appropriate fractional distance from laser array 102.

During operation, light from laser array 102 is reflected up through phase corrector array 118. Distance D is selected so that the illumination produced at that plane has relatively uniform amplitude due to Fresnel diffraction and a non-uniform phase distribution. Phase corrector array 118, which may be a multi-level diffractive optics phase plate, corrects the phase of the received illumination so as to produce a relatively uniform phase distribution and thereby couple energy into an on-axis plane wave 124 that is emitted from the structure. Partially reflecting mirror 122 reflects a fraction of the on-axis plane wave back through phase corrector 118 to laser array 102 thereby forming a resonant cavity which induces lasing and establishing coherency among the resulting laser beams.

In another embodiment, transparent layer 116 is replaced by an air gap, and the phase corrector/output mirror assembly 118, 120, and 122 is held the proper distance from the laser array by means of spacers.

Figure 8:
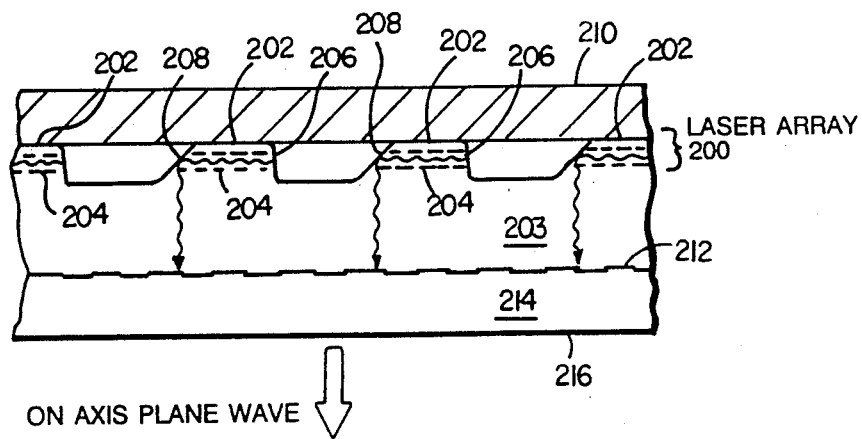
FIG. 8 illustrates another embodiment which employs turning mirrors that direct the emitted laser beams through the substrate.

Other embodiments are within the following claims. For example, the phase corrector plate may be formed on the backside of the substrate containing the laser array. As shown in FIG. 8, laser array 200 consisting of surface emitting laser elements 202 is formed on one side of a substrate 203. Each laser element 202 includes a horizontal gain region 204 having on one end a reflecting surface 206 that is perpendicular to the plane of substrate 204 and on the other end an angled reflecting surface 208. When light from a laser element 202 reaches angled surface 208, it reflects downward through substrate 203. That is, the index of refraction of layer 203 is typically high enough that total reflection occurs at angled surface 208 without having to supply any reflecting coating. For a description of one method for fabricating a laser array having such downward reflecting turning mirrors refer to U.S. patent application Ser. No. 325,292 entitled "Two-Dimensional Surface Emitting Laser Array" by W. D. Goodhue et al. and incorporated herein by reference.

Above and resting on laser array 200, there is a heat sinking layer 210 made of a heat conductive material such as, for example, diamond or Beryllium oxide, for cooling laser array 200.

A phase corrector array 212 is etched into the back side of substrate 203. The thickness of substrate 203 is selected to be the appropriate fractional Talbot distance for producing a high coupling efficiency. Below phase corrector array 212 there is a transparent dielectric layer 214 having an index of refraction that is different from the index of refraction for substrate 203. Finally, transparent layer 214 supports a flat partially reflecting mirror 216.

In another embodiment, the apparatus of FIG. 8 is modified by using a thin substrate and including a spacer material of appropriate thickness to separate the laser array from the phase corrector plate.

Figure 9:
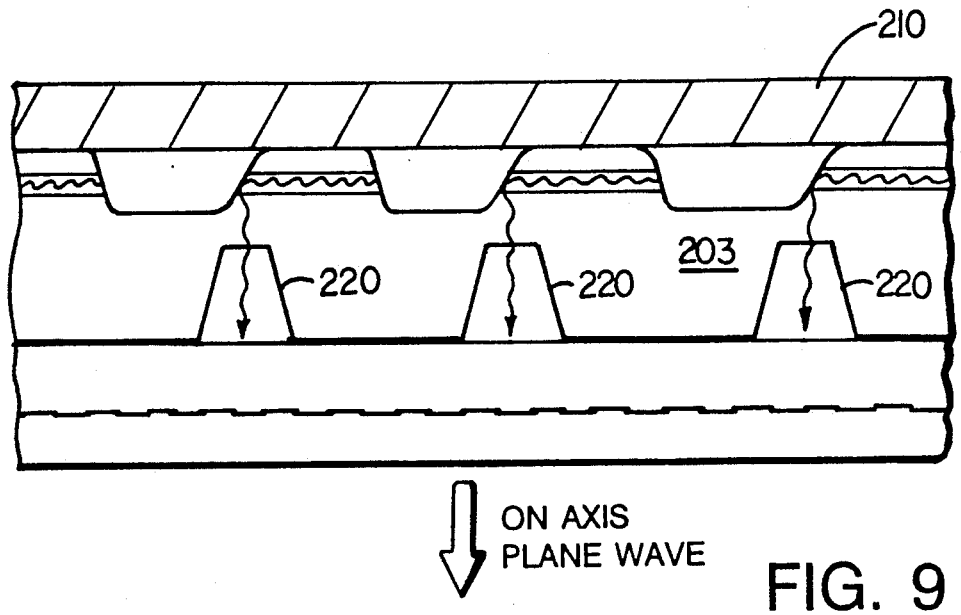
FIG. 9 illustrates an embodiment employing apertures through the substrate.

If substrate 203 is made of a material that is not particularly transparent to the wavelength of light emitted by laser array 200, it may be appropriate to etch apertures 220 into substrate 203, as shown in FIG. 9. This would be appropriate if the substrate is AlGaAs, for example.

Figure 10:
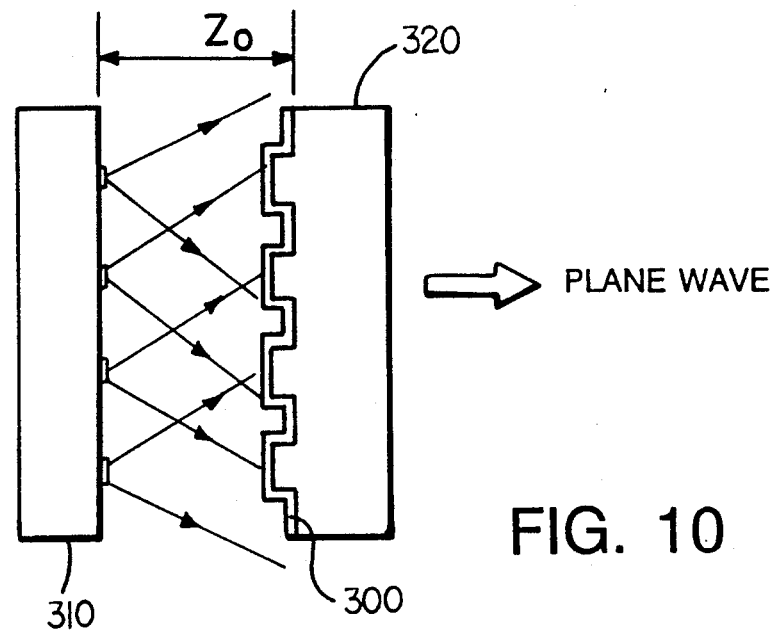
FIG. 10 illustrates an embodiment in which the partially reflecting mirror is located between the laser array and the phase corrector element.

Yet another embodiment has the partially reflecting mirror 300 between the laser array 310 and the phase corrector element 320, as shown in FIG. 10. In particular, the etched, multi-level surface of phase corrector element 320 faces laser array 310 and partially reflecting mirror 300 is formed on the etched surface of phase corrector element 320. In this case, the light distribution at the phase corrector is given by $g(x,y)\exp[j\phi(x,y)]$. The phase corrector element with the semi-transparent mirror is designed such that the reflectance from the surface with the mirror imposes a phase shift of $\exp[-j2\phi(x,y)]$. Thus, the reflected light traveling back to the laser array has an amplitude given by:

$$g(x,y) \exp[j\phi(x,y)]\exp[-j2\phi(x,y)] = g(x,y) \exp[-j\phi(x,y)].$$

This phase conjugate distribution forms an image of the laser apertures at the source plane. The phase delay is related to the depth of the etch for a reflection element by $\phi = (4\pi/\lambda)x$, where $\lambda$ is the wavelength in the propagating medium, and x is the depth of the etch. The transmitted component must have a phase transmittance of $\exp[-j\phi(x,y)]$ so as to completely cancel the phase variation of the incident beam to thereby produce a plane wave. The phase transmittance of the element is given by $\phi = (2\pi/\lambda_o)(n'-n)x$, where n and n' are the indices of refraction of the propagating medium and the substrate, respectively, and $\lambda_o$ is the free-space wavelength. By choosing $|n'-n|=1$, the transmitted phase delay is given by $\phi = (2\pi/\lambda_o)x$. In free-space $n=1$, therefore, n' must equal 2. Thus, a structure designed to have a phase transmittance of $\exp[-j\phi(x,y)]$ also has a phase reflectance of $\exp[-j2\phi(x,y)]$, as required. $Z_0$, the separation of the phase corrector element and laser array, is chosen as before.

What is claimed is:
1. Apparatus for generating a coherent combined laser beam comprising:
an array of laser elements for generating a Fresnel diffraction pattern in a plane at a distance D from said laser array, said Fresnel diffraction pattern having a non-uniform phase distribution, D being at least as large as the distance at which the beams generated by said laser array begin to substantially overlap;

an array of phase corrector elements located in said plane for reducing the degree of non-uniformity in said phase distribution; and a partially reflecting mirror for forming a resonant cavity for said laser array.

2. The apparatus of claim 1 wherein said partially reflecting mirror is located between said laser array and said phase corrector array.

3. The apparatus of claim 1 wherein said phase corrector array is located between said laser array and said mirror.

4. Apparatus for generating a coherent combined laser beam comprising:

an array of laser elements;

an array of phase corrector elements positioned in a plane located a distance D from said laser array for producing said combined laser beam, D being selected so that said laser array generates multiple images of said laser array, each of said multiple images having an associated phase, said phase corrector array shifting the phase of each of said multiple images by an amount corresponding to the complex conjugate of said associated phase; and a partially reflecting mirror for forming a resonant cavity for said laser array.

5. The apparatus of claim 4 wherein said partially reflecting mirror is located between said laser array and said phase corrector array.

6. The apparatus of claim 4 wherein said phase corrector array is located between said laser array and said mirror.

7. The apparatus of claim 1 wherein said plane is a high efficiency plane, said high efficiency plane being any plane for which the coupling efficiency as defined by the relative power contained in the central lobe of the far field pattern of said combined laser beam is at a peak.

8. Apparatus for combining light beams generated by an array of laser elements comprising an array of phase corrector elements for being positioned in a plane located a distance D from said laser array, D being selected so that said laser array generates multiple images of said laser array at said plane, each of said multiple images having an associated phase, said phase corrector array shifting the phase of each of said multiple images by an amount corresponding to the complex conjugate of the said associated phase.

9. Apparatus for combining light beams generated by an array of laser elements, the laser array generating a Fresnel diffraction pattern in a plane at a distance D from said laser array, said Fresnel diffraction pattern having a non-uniform phase distribution, D being at least as large as the distance at which the beams generated by said laser array begin to substantially overlap, the apparatus comprising an array of phase corrector elements for being positioned in said plane and for reducing the degree of non-uniformity in said phase distribution.

10. The apparatus of claim 1, 4, 8 or 9 wherein said laser array is a one-dimensional array.

11. The apparatus of claim 1, 4, 8 or 9 wherein said laser array is a two-dimensional array.

12. The apparatus of claim 1, 4, 8 or 9 wherein said phase corrector array generates a substantially uniform phase distribution for the light from the laser array.

13. The apparatus of claim 1, 4, 8 or 9 wherein said phase corrector array is a multi-level diffractive optics array.

14. The apparatus of claim 1, 4, 8 or 9 wherein each of said laser elements comprises a surface emitting laser.

15. The apparatus of claim 14 wherein said laser array further comprises an array of turning mirrors, each of said turning mirrors for receiving light from a corresponding one of said laser elements.

16. The apparatus of claim 1 or 4 wherein said laser array, said phase corrector array and said mirror are formed on a single substrate so as to create an integrated structure.

17. The apparatus of claim 8 or 9 further comprising a spacer for holding said phase corrector array at said distance D from the laser array.

* * * * *